(12) United States Patent
Bailey et al.

(10) Patent No.: US 12,292,463 B2
(45) Date of Patent: May 6, 2025

(54) METHOD AND SYSTEM FOR IDENTIFYING EXTERNAL PIM SOURCES

(71) Applicant: Kaelus Pty Ltd, Cannon Hill (AU)

(72) Inventors: Martin Bailey, Cannon Hill (AU); Mostafa Abushaaban, Cannon Hill (AU)

(73) Assignee: Kaelus Pty Ltd, Cannon Hill (AU)

( * ) Notice: Subject to any disclaimer, the term of this patent is extended or adjusted under 35 U.S.C. 154(b) by 35 days.

(21) Appl. No.: 17/997,516

(22) PCT Filed: Apr. 30, 2021

(86) PCT No.: PCT/AU2021/050394
§ 371 (c)(1),
(2) Date: Oct. 28, 2022

(87) PCT Pub. No.: WO2021/217214
PCT Pub. Date: Nov. 4, 2021

(65) Prior Publication Data
US 2023/0243879 A1    Aug. 3, 2023

(30) Foreign Application Priority Data

Apr. 30, 2020 (AU) .............................. 2020901372

(51) Int. Cl.
*G01R 29/08* (2006.01)
*H04B 17/00* (2015.01)
(Continued)

(52) U.S. Cl.
CPC ..... *G01R 29/0814* (2013.01); *H04B 17/0085* (2013.01); *H04B 17/204* (2023.05); *H01Q 1/243* (2013.01)

(58) Field of Classification Search
CPC .............. G01R 29/0814; H04B 17/204; H04B 17/0085; H01Q 1/243
See application file for complete search history.

(56) References Cited

U.S. PATENT DOCUMENTS

| 9,977,068 B1 * | 5/2018 | Bradley ................. H04B 17/14 |
| 10,237,765 B1 * | 3/2019 | Bradley ............ H04B 17/0085 |
| 2015/0133111 A1 * | 5/2015 | Bevan .................... H04B 1/123 |
| | | 455/423 |

FOREIGN PATENT DOCUMENTS

WO    2021217214 A1    11/2021

OTHER PUBLICATIONS

International Search Report, mailed Jul. 26, 2021, by the ISA/AU, in connection with PCT Application No. PCT/AU/2021/050394; 4 pages.

(Continued)

*Primary Examiner* — Jermele M Hollington
*Assistant Examiner* — Taqi R Nasir
(74) *Attorney, Agent, or Firm* — Barta Jones, PLLC

(57) ABSTRACT

Methods and systems for identifying PIM sources for an antenna under test (AUT) are provided, where the AUT is installed in a desired operating environment. The system comprises: a PIM analyser, connected to the AUT for applying first and second RF stimulus signals to an input port of the AUT; and a portable RF emitter, configured to apply a third RF stimulus signal to suspected external PIM sources. The PIM analyser is configured to measuring one or more characteristics of PIM signals received by the AUT generated by the first, second and third RF stimulus signals.

20 Claims, 11 Drawing Sheets

(51) Int. Cl.
*H04B 17/20* (2015.01)
*H01Q 1/24* (2006.01)

(56) References Cited

OTHER PUBLICATIONS

Written Opinion, mailed Jul. 26, 2021, by the ISA/AU, in connection with PCT Application No. PCT/AU/2021/050394; 4 pages.

\* cited by examiner

METHOD AND SYSTEM FOR IDENTIFYING EXTERNAL PIM SOURCES

TECHNICAL FIELD

The present invention relates to the identification of passive intermodulation (PIM) sources. In particular, although not exclusively, the invention relates to identification of external PIM sources for a cellular communications antenna in situ.

BACKGROUND ART

Antennas are important building blocks in many radio communications systems, and particularly cellular communication systems. As cellular communications networks grow and develop, new antennas are installed in greater densities, particularly in cities and urban areas.

Passive intermodulation (PIM) distortion in such cellular communications systems is of particular concern, as PIM distortion may have a significant impact on antenna performance. In short, PIM is a form of electromagnetic interference that arises from devices or components with nonlinear transfer characteristics. Examples of PIM sources in an antenna include oxidised metal-on-metal junctions, loose connectors, and a myriad of other manufacturing imperfections.

The internal construction of modern mobile communications antennas is very complex, and they typically contain hundreds of interconnects, cables and components, and therefore have many possible PIM locations. As such, PIM testing is generally complex, and is often performed in a laboratory environment when the antennas are manufactured.

A problem, however, is that even if an antenna is sufficiently free of PIM sources when tested in a laboratory environment, PIM may be present when the antenna is installed. Such PIM can be from installation of the antenna itself, such as problems in cabling, or external to the antenna, such as from objects in the surrounding environment.

Certain methods exist which enable distance-to-PIM source testing, which are based upon reflectometry. Such methods are useful when the PIM source is contained within a transmission line, cable, filter, or the antenna itself, as it helps identify the location of the PIM source. These methods are not, however, particularly helpful when the PIM source is exposed in the open air and activated by the radiated power from an antenna. As such, methods also exist where suspected PIM sources external to the antenna are physically swept with a probe.

FIG. 1 illustrates a schematic of a system 100 for detecting PIM in an AUT 105, according to the prior art. A PIM tester 110 is coupled to the AUT 105 and is configured to apply RF stimulus signals to the AUT 105, which thereby excite an external PIM source 115. A probe 120 comprising a receiver is then physically moved around objects, and a signal is received and filtered with a bandpass filter 120a and analysed with a signal analyser 120b. When in proximity to the PIM source 115, the signal analyser 120b detects high PIM levels, thereby identifying the PIM source 115.

A problem with such probe-based testing is that there are often many PIM sources in an area, and it may not be possible to access all potential PIM sources. This is particularly the case in cities where antennas are often installed on rooftops. A further problem is that clearing an area of all identified PIM sources may be very costly, or simply not possible.

As such, there is clearly a need for improved identification of external PIM sources, particularly in relation to cellular communications antenna in situ.

It will be clearly understood that, if a prior art publication is referred to herein, this reference does not constitute an admission that the publication forms part of the common general knowledge in the art in Australia or in any other country.

SUMMARY OF INVENTION

The present invention is directed to methods and systems for identifying external PIM sources of an antenna installation, which may at least partially overcome at least one of the abovementioned disadvantages or provide the consumer with a useful or commercial choice.

With the foregoing in view, the present invention in one form, resides broadly in a system for identifying an external passive intermodulation (PIM) source of an antenna under test (AUT), the AUT installed in a desired operating environment, the system comprising:
   a PIM analyser, connected to the AUT for applying first and second RF stimulus signals to an input port of the AUT; and
   a portable RF emitter, configured to apply a third RF stimulus signal to suspected external PIM sources;
   wherein the PIM analyser is configured to measure one or more characteristics of PIM signals received by the AUT generated by the first, second and third RF stimulus signals.

Advantageously, the use of the third RF stimulus signal, applied by the portable RF emitter to suspected external PIM sources enables the system to not only identify a location of an external PIM source, but also determine the impact of external PIM sources on the AUT. This in turn enables external PIM sources to be considered based upon their impact on the AUT, which in turn reduces time and cost associated with addressing PIM sources in the operating environment of the AUT.

By essentially encoding the suspected external PIM Source, the system is able to measure if this encoding is detected in the network and thus if the suspected PIM Source is indeed causing interference in the network. Subsequently, any suspected PIM source that is detected in the network that influences the network is able to be reduced or eliminated to meet the specification of the installation. Similarly, any suspected PIM sources that do not influence the network (or in a significant manner) may simply be ignored, thereby reducing time and expense in shielding or otherwise addressed these suspected PIM sources.

Preferably, the portable RF emitter is configured to generate the third RF stimulus signal at a selected frequency of a plurality of different operating frequencies. This enables the portable RF emitter to be configured according to a particular scenario or AUT configuration.

Preferably, the third RF stimulus signal is generated at a frequency such that a resultant PIM signal from the third RF stimulus signal is at a frequency in a receiver band of the PIM analyser.

The resultant PIM signal measured by the PIM analyser may comprise a third order PIM signal from the first and second RF stimulus signals. The resultant PIM signal measured by the PIM analyser may comprise a third order PIM signal from the first, second and third RF stimulus signals.

Preferably, the resultant PIM signal measured by the PIM analyser comprises 1) a third order PIM signal from the first and second RF stimulus signals, and 2) a third order PIM signal from the first, second and third RF stimulus signals.

The first and second RF stimulus signals may be provided at first and second frequencies (F1 and F2), and the third RF stimulus signal at a third frequency (F3).

The first and second frequencies (F1 and F2) may be selected such that F1, F2, a third order PIM signal from the first and second RF stimulus signals (IM3), or any local oscillators do not produce internal interference from any intermodulation (IM) product being created.

The third frequency (F3) may be selected such that the resultant PIM Frequency (IM3new, F1+F2−F3) is such that it lands within the receiver band of the PIM analyser and by the formula F3=F1+F2−IM3new.

The first and second signals may comprise signals generated using one or more local oscillators. Alternatively, the first and second signals may comprise BTS radio signals. In such case, the BTS radio signals may comprise pulsed envelope signals.

Preferably, the system is configured to determine an impact on the AUT of a suspected external PIM source to which the third RF stimulus signal is applied.

The system may be configured to determine an impact of the suspected external PIM source according to a magnitude of a third order PIM signal from the first, second and third RF stimulus signals.

The system may be configured to determine an impact of the suspected external PIM source according to a magnitude of a third order PIM signal from the first, second and third RF stimulus signals with reference to a magnitude of a third order PIM signal from the first and second RF stimulus signals.

The system may be configured to determine an impact of the suspected external PIM source by determining the coexistence of both a third order PIM signal from the first, second and third RF stimulus signals a third order PIM signal from the first and second RF stimulus signals above a particular threshold.

The system may include a second AUT, configured to be tested simultaneously with the AUT. A second PIM analyser may be connected to the second AUT. The third RF stimulus signal may be provided such that PIM received by the AUT and the second AUT is generated from the third RF stimulus signal.

The second PIM analyser may be for applying fourth and fifth RF stimulus signals to an input port of the second AUT such that PIM signals received by the second AUT are generated by the third, fourth and fifth RF stimulus signals.

The portable RF emitter may be configured to apply the third RF stimulus signal to suspected external PIM sources by applying the third RF stimulus signal in close proximity to the suspected external PIM sources. The portable RF emitter may be configured to apply the third RF stimulus signal within about 1 m of the suspected external PIM sources.

The portable RF emitter may comprise an elongate wand, wherein the third signal is emitted from an end thereof. Such configuration enables a user to apply the third RF stimulus signal to the suspected external PIM sources while keeping his or her body away from the suspected external PIM sources, thereby reducing a likelihood of shielding PIM with the person's body.

The portable RF emitter may include a receiver, for receiving one or more PIM signals. The receiver may be configured to determine a magnitude of a third order PIM signal from the first and second RF stimulus signals.

The system may include a display associated with the receiver. The display may be configured to display a magnitude of the PIM signal. The system may be configured to emit an alarm (e.g. an audible alarm) when the signal is above a threshold.

The portable RF emitter and receiver may be configured to operate in a switched manner between first and second modes, such that it may operate in a first PIM locating mode, where the receiver is configured to receive PIM from the first and second signals for locating, and a second signal generating mode, where the emitter is configured to emit the third RF stimulus signal. This in turn enables the portable RF emitter and receiver to have the dual function of operating in a similar manner to the prior art mentioned in relation to FIG. 1.

The system may include a Range-to-Fault (RTF) module, to determine a distance to one or more suspected PIM sources. Such RTF module may simplify identification of PIM sources.

In another form, the invention resides broadly in a method for identifying an external passive intermodulation (PIM) source of an antenna under test (AUT), the AUT installed in a desired operating environment, the method including:

applying first and second RF stimulus signals to an input port of the AUT;

applying a third RF stimulus signal to a suspected external PIM source using a portable RF emitter; and measuring one or more characteristics of PIM signals received by the AUT generated by the first, second and third RF stimulus signals using a PIM analyser.

In yet another form, the invention resides broadly in a system for identifying a passive intermodulation (PIM) source of an antenna under test (AUT), the system comprising:

a signal generator, connected to the AUT for applying one or more RF stimulus signals to an input port of the AUT; and a portable RF emitter, configured to apply an RF stimulus signal to a suspected PIM source.

In yet another form, the invention resides broadly in a method for passive intermodulation (PIM) or harmonic testing of at least one antenna under test (AUT), the method comprising:

applying one or more RF stimulus signals to an input port of the AUT; and applying an RF stimulus signal to a suspected PIM source using a portable RF emitter.

PIM signals received by the AUT generated by the RF stimulus signals, both from the signal generator and portable RF emitter, may then be used to identify the PIM source.

The antenna under test may be a phased array antenna. The suspected PIM source may include a branch of the phased array antenna.

Any of the features described herein can be combined in any combination with any one or more of the other features described herein within the scope of the invention.

The reference to any prior art in this specification is not, and should not be taken as an acknowledgement or any form of suggestion that the prior art forms part of the common general knowledge.

BRIEF DESCRIPTION OF DRAWINGS

Various embodiments of the invention will be described with reference to the following drawings, in which.

Preferred features, embodiments and variations of the invention may be discerned from the following Detailed Description which provides sufficient information for those skilled in the art to perform the invention. The Detailed Description is not to be regarded as limiting the scope of the preceding Summary of the Invention in any way.

DESCRIPTION OF EMBODIMENTS

Figure 1:
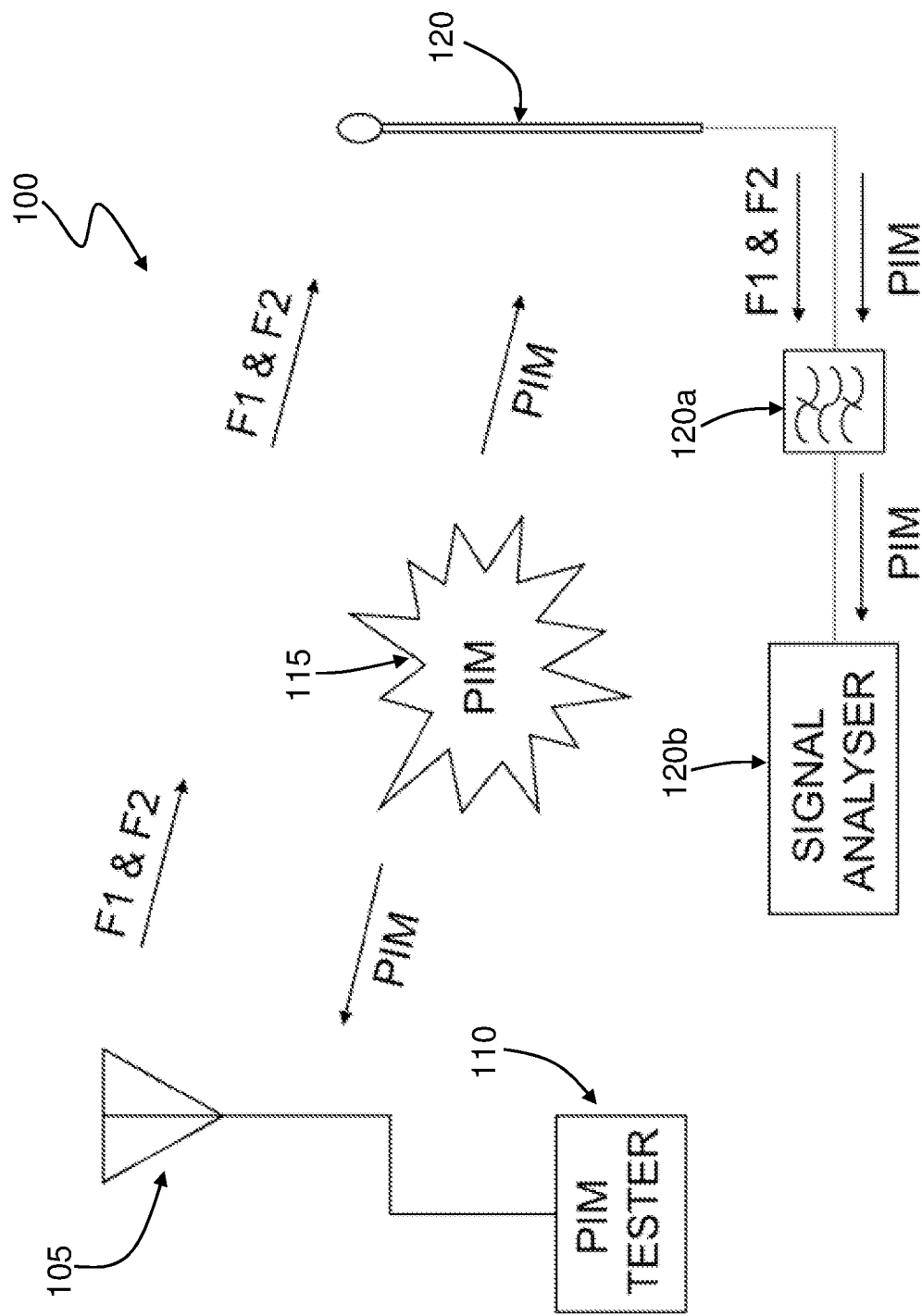
FIG. 1 illustrates a schematic of a system for detecting PIM in an AUT, according to the prior art.
Figure 2:
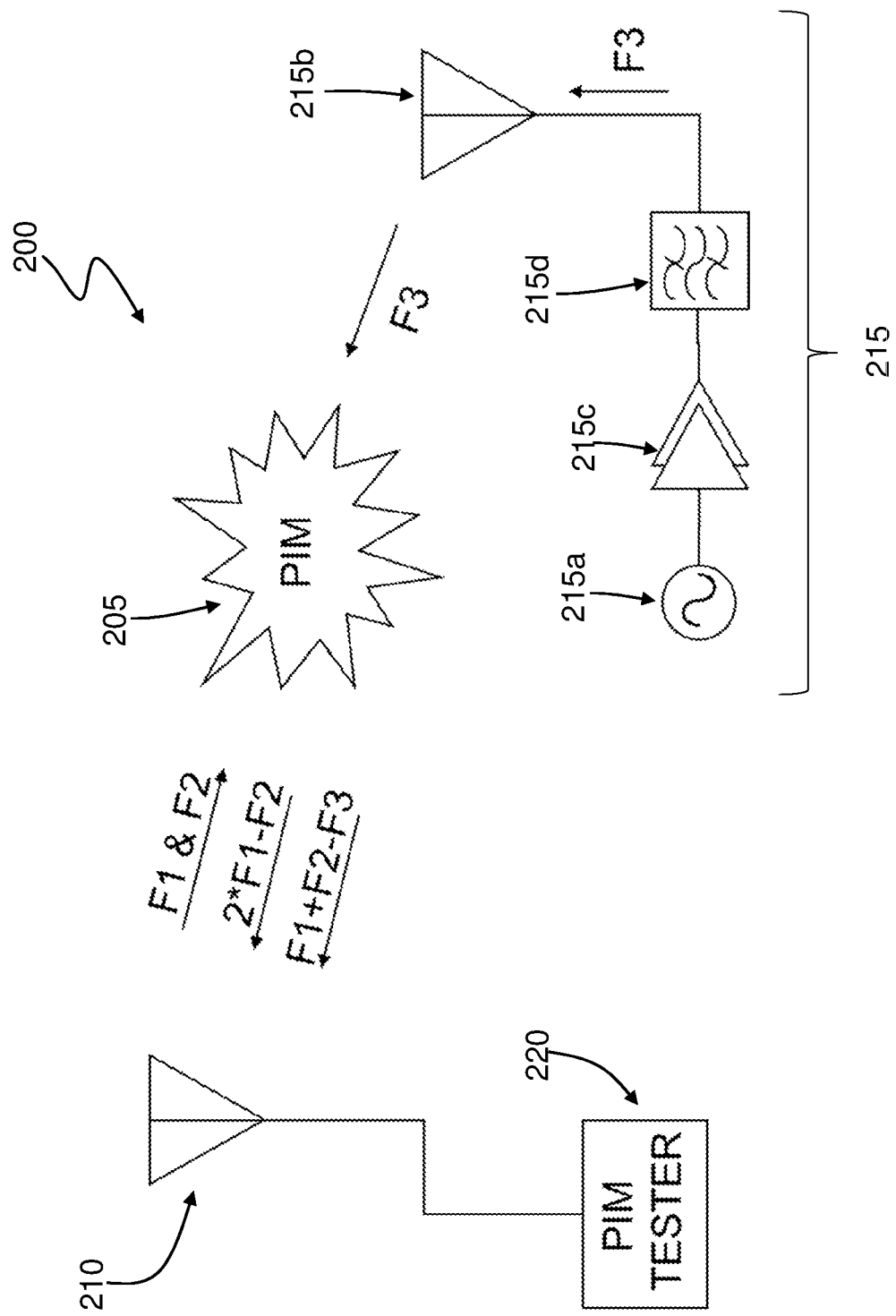
FIG. 2 illustrates a schematic of a system for identifying an external passive intermodulation (PIM) source of an antenna under test (AUT), according to an embodiment of the present invention.

FIG. 2 illustrates a schematic of a system 200 for identifying an external passive intermodulation (PIM) source 205 in an antenna under test (AUT) 210, according to an embodiment of the present invention.

The system 200 enables both identification of a location of an external PIM source, such as the PIM source 205, but also identification of the impact of such external PIM sources on the AUT 210. This in turn enables external PIM sources to be considered based upon their impact on the AUT 210, which in turn reduces time and cost associated with addressing PIM sources in the operating environment of the AUT that do not impact the AUT 210.

The system 200 includes a portable RF emitter 215, which is used by a technician on site to probe suspected PIM sources. In particular, the portable RF emitter emits a tone to "encode" the suspected PIM Source. A PIM tester 220 coupled to the AUT 210 is then able to measure if this encoding is detected and thus if the suspected PIM Source 205 is indeed causing interference in the network.

This enables the technician to focus on rectifying suspected PIM sources that are detected in the network that influence the network, while ignoring any suspected PIM sources that do not influence the network (or in a significant manner). This in turn reduces time and expense in shielding or otherwise addressing the suspected PIM sources that do not influence the network.

The PIM tester 220 is configured to apply first and second RF stimulus signals to an input port of the AUT 210, such that the AUT 210 transmits signals at frequencies F1 and F2. The first and second RF stimulus signals excite the PIM source 205, and a third order PIM signal (2*F1-F2) is generated.

The first and second frequencies (F1 and F2) are selected such that F1, F2, the third order PIM signal (2*F1-F2) and any local oscillators (e.g. of the PIM tester 220) do not produce internal interference from any intermodulation (IM) product being created.

The PIM tester 220 is able to analyse this third order PIM signal to determine a distance to the PIM source 205, e.g. using a Range-to-Fault (RTF) module. Such distance data may be useful in assisting the technician in identifying a physical location of the PIM source 205.

The portable RF emitter 215 comprises a local oscillator 215a, which is configured to generate a third RF stimulus signal at frequency F3, and emit such signal from an antenna 215b thereof. As will be readily understood by the skilled addressee, the portable RF emitter 215 further includes amplifier(s) 215c, band pass filter(s) 215d and other components.

The frequency F3 is selected such that it excites the PIM source 205, and generates a third order PIM signal (F1+F2−F3) that lands within the receiver band of the PIM tester.

The portable RF emitter 215, once configured to emit a signal at F3, is used to manually sweep an area to apply the third RF stimulus signal to suspected external PIM sources, including the PIM source 205. In particular, the RF emitter 215 is moved around such that the antenna 215b directs the third RF stimulus signal to different areas, with a view of identifying the PIM source 205.

While the portable RF emitter 215 is emitting the third RF stimulus signal, the PIM tester 205 is configured to measure one or more characteristics of the PIM signals received by the AUT generated by the first, second and third RF stimulus signals, namely the three-tone PIM signal (F1+F2−F3) and the two-tone PIM signal (2*F1−F2).

The PIM tester 220 determines an impact of the suspected external PIM source 205 on the AUT 210 according to a magnitude of the three-tone PIM signal, particularly with reference to the two-tone PIM signal.

In one embodiment, the PIM tester 220 determines an impact of the suspected external PIM source 205 by determining the coexistence of both the three-tone PIM signal (F1+F2−F3, referred to as IM3New) and the two-tone PIM signal (2*F1−F2) above a particular threshold.

Once it is determined whether the PIM source 205 is impacting the AUT 210, and thus whether it needs to be rectified, the technician is able to rectify the PIM source 205, and re-assess the AUT 210 and potentially address other suspected PIM sources.

While the portable RF emitter 215 has been described as being held by a technician to probe suspected PIM sources, in other embodiments the portable RF emitter 215 may be mounted to a robot, an autonomous vehicle or a drone, for example. As a result, a technician need not actually be in proximity to the suspected PIM sources.

The amplitude of the third RF stimulus signal may be selected such that the three-tone PIM signal is only received at the AUT 210 if the PIM source 205 is influencing the AUT 210. Alternatively, the third RF stimulus signal may be emitted at multiple amplitudes, to determine whether the PIM source 205 impacts the AUT 210, may impact the AUT 210, or does not impact the AUT 210. In general, the third tone is modulated to mark its products. In the case of CW tone amplitude modulation, amplitude keying allows clear identification of the products as these are the only signals that will have the same rate amplitude keying. In the case of bi-phase modulation, phase shift keying allows clear separation of the products generated by the third tone.

FIGS. 3a-3f illustrate the effect of varying the amplitude of the third RF stimulus signal (at F3) on the three-tone PIM signal. The first and second stimulus signals are equal in amplitude and constant across all figures, and as a result the two-tone PIM signal (2*F1–F2, IM3) is also constant.

Figures 3A, 3B, 3C, 3D, 3E, 3F:
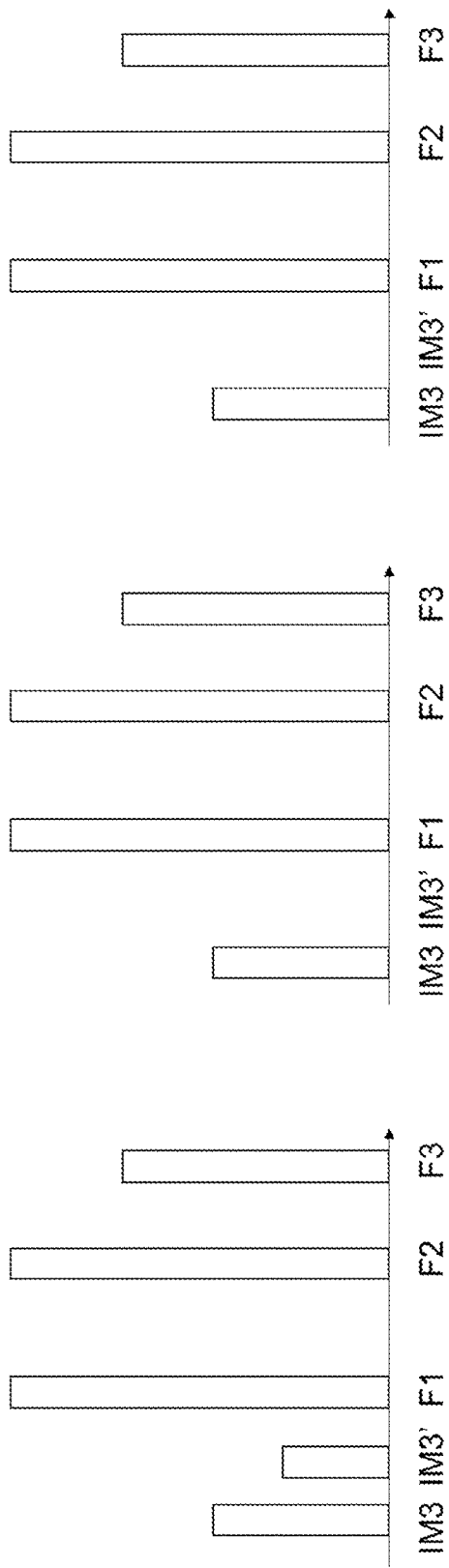
FIGS. 3a-3f illustrate the effect of varying the amplitude of the third RF stimulus signal (at F3) on the three-tone PIM signal.

FIGS. 3a-3c illustrate the third RF stimulus signal (at F3) having an amplitude lower than that of the first and second stimulus signals for each of a plurality of PIM sources that have a definite influence (FIG. 3a), have a probable influence (FIG. 3b) and have no influence (FIG. 3c). As can be seen from FIGS. 3a-3c, the three-tone PIM signal (F1+F2–F3, IM3') is only present for PIM sources that have a definite influence (FIG. 3a).

FIGS. 3d-3f illustrate the third RF stimulus signal (at F3) having an amplitude equal to that of the first and second stimulus signals for each of PIM sources that have a definite influence (FIG. 3d), have a probable influence (FIG. 3e) and have no influence (FIG. 3f). As can be seen from FIGS. 3d-3f, the three-tone PIM signal (F1+F2–F3, IM3') is present for PIM sources that have a definite influence (FIG. 3d) and PIM sources that have a probable influence (FIG. 3e).

As such, by using two different amplitudes for the third RF stimulus signal (at F3), the system is able to determine whether a PIM source has a definite influence, a probable influence, or no influence on the AUT.

The model used in FIGS. 3a-3f makes the following assumptions:
Amplitude of F1, F2, F3 is A1, A2, A3 respectively;
Amplitude of the IM3new created by $$2*F1-F2 \text{ is } A4 = \frac{3}{4}A1^2 A2 \; \alpha_3;$$

Amplitude of the IM3new created by $$F1+F2-F3 \text{ is } A5 = \frac{3}{2}A1 \; A2 \; A3 \; \alpha_3;$$

Amplitude of F1 and F2 are similar;
In dB terms A4=20 Log 10 (3)–20 Log 10 (4)+40 Log 10 (A1)+20 Log 10 (A2)+20 Log 10 (+$_3$), where $\alpha_3$ depends on the PIM source
A5=20 Log 10 (3)–20 Log 10 (2)+20 Log 10 (A1)+20 Log 10 (A2)+20 Log 10 (A3)+20 Log 10 ($\alpha$3)
A change of a 1 dB is 12% increase in amplitude
The factor −20 Log 10 (2) which is the difference of the three tone IM3 to the two tone IM3 is 6 dB in the case of all A1, A2, A3 are equal
The PIM Source is not saturated by F1 & F2 nor by the introduction of F3;
PIM Slope 3:1 model; and
PIM Source is −60 dBm under 2×43 dBm excitation
IM3 and IM3New are both low side products (e.g. Rx band of interest is only low side).
And the following outcomes:

$\Delta A4=2*\Delta A1+\Delta A2$ e.g. Where A4=−60 dBm and A1, A2=43 dBm
A1, A2 decrease to 40 dBm
A4=A4–(6+3)
A4=−69 dBm $\Delta A5=\Delta A1+\Delta A2+\Delta A3$ e.g. Where A5=−60 dBm and A1, A2,A3=41 dBm
A3 increases to 43 dBm
A5=A5+ (0+0+2)
A5=−58 dBm $A5=A4+6$ dB where $A1$, $A2$, $A3$ are equal;

e.g. Where A4=−60 dBm with A1, A2=43 dBm
A5=A4+6 where A3=43 dBm
A5=−54 dBm

The inventors have also observed the impact of the amplitude of the third RF stimulus signal (at F3) on third order PIM signals.

In particular, a spectrum analyser was connected to a 4-way microstrip combiner with one input of the combiner terminated and the three signal inputs connected to three separate signal generators.

The first and second RF stimulus signals (at F1 & F2) were injected into the combiner at frequency 1001 & 1001.02 MHz respectively at power level-25 dBm.

The third RF stimulus signal (at F3) was injected into the third port of the combiner at frequency 1001.05 and swept in power levels between-50 dBm and OdBm in 5 dB steps.

Four IM3 signals were measured on the Spectrum Analyser simultaneously, namely:

IM3$F1F2$=2*$F1$–$F2$=1000.98 MHz

IM3$F1F2F3$=$F1$+$F2$–$F3$=1000.97 MHz

IM3$F1F3$=2*$F1$–$F3$=1000.95 MHz

IM3$F2F3$=2*$F2$–$F3$=1000.99 MHz

Figure 4:
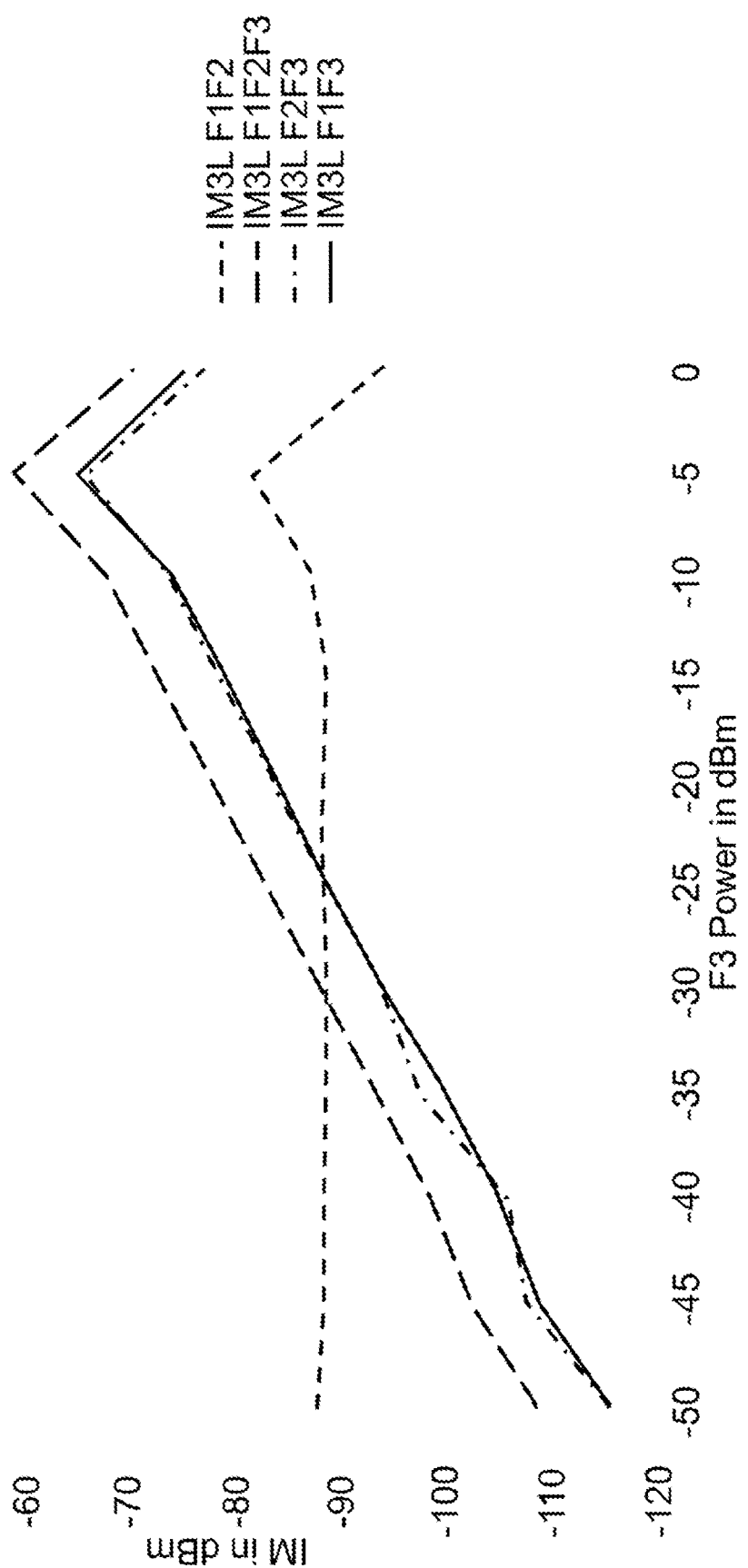
FIG. 4 illustrates a plot of the four IM3 signals with reference to F3 Power.

FIG. 4 illustrates a plot of the four IM3 signals with reference to F3 Power.

As can be seen from FIG. 4:
1) IM3F1F2, the two tone IM3, is not affected by Amplitude of F3 until F3 amplitude is 10 dBm higher in magnitude than F1&F2;
2) Where IM3F1F2 starts to change upwards in magnitude and then reduce is seen similarly in IM3 products containing F3; and
3) Where the magnitude of IM3F1F2F3, three tone IM3, is equal to IM3F1F2 the magnitude of F3 is below that of F1&F2 by around 6 dB.

The inventors believe that the common change in magnitude occurs where the PIM source starts to compress or saturate.

Now turning back to FIG. 2, the portable RF emitter 215 may take any suitable form, such as handheld, enabling it to me moved to suspect PIM sources.

The portable RF emitter 215 may comprise an elongate wand, wherein the third RF stimulus signal is emitted from an end thereof. Such configuration enables a user to apply the third RF stimulus signal to the suspected external PIM sources while keeping his or her body away from the suspected external PIM sources, thereby reducing a likelihood of shielding PIM with the person's body.

While the above description refers to the third stimulus signal in the singular, the skilled addressee will readily appreciate that different AUT configurations, and different first and second stimulus signal configurations will require a different third stimulus signal frequency. The portable RF emitter 215 is therefore configured to generate the third RF stimulus signal at one frequency of a plurality of different operating frequencies in which it may operate. In other words, the portable RF emitter 215 is configurable as to at which frequency it operates.

While the above system 200 utilises a portable RF emitter 215, a portable RF transceiver may be used. In such case, a receiver portion of the portable RF transceiver may be used to first identify a location of the suspected PIM source, in a similar manner to the probe 120, upon which the PIM source may be further analysed.

Figure 5:
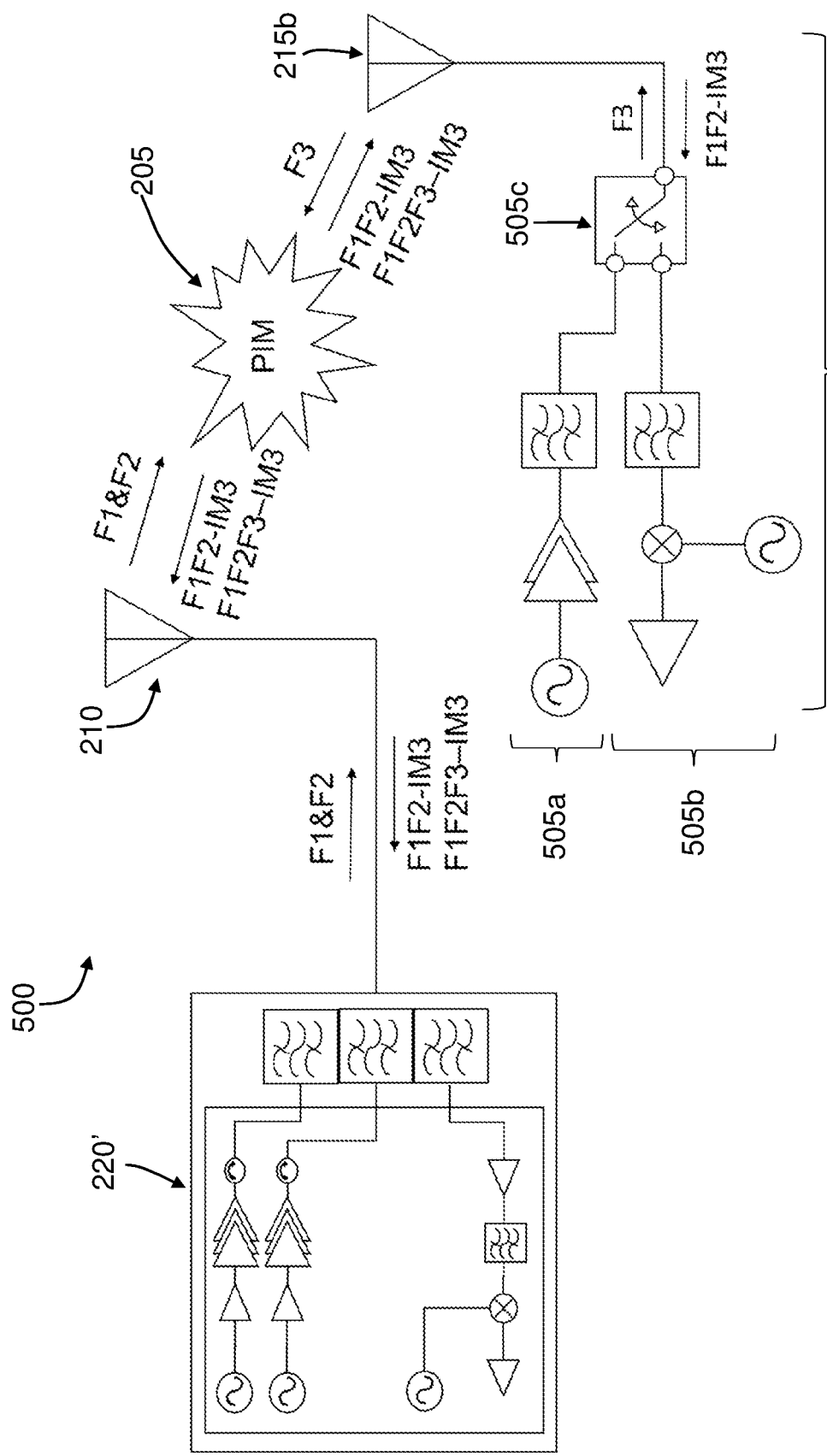
FIG. 5 illustrates a schematic of a system for identifying an external PIM source of an AUT, according to an embodiment of the present invention.

FIG. 5 illustrates a schematic of a system 500 for identifying an external PIM source 205 in an AUT 210, according to an embodiment of the present invention.

The system 500 is similar to the system 200, but includes a portable RF transceiver 505 in place of the portable RF emitter 215.

The portable RF transceiver includes a transmitter portion 505a, similar to the portable RF emitter 215, and a receiver portion 505b, similar to the probe 120.

In use, the portable RF transceiver 505 first receives the dual-tone PIM signals (F1F2–IM3), which enables a technician to identify a location of the PIM source 205 by sweeping an area. The portable RF transceiver 505 may include a display associated with the receiver, configured to display a magnitude of the two-tone PIM signal. The portable RF transceiver 505 may also be configured to emit an alarm (e.g. an audible alarm) when the dual-tone PIM signal is above a threshold.

The portable RF transceiver 505 may function much like a homing device, that is swept over an area, and which may provide a signal to an operator indicating the presence of a PIM source. In particular, the transceiver 505 may be configured to beep louder, or at a higher frequency, for example, the closer it is to a PIM source.

Similarly, the portable RF transceiver 505 may function as, or provide functionality mimicking, an integrated compass to enable easy triangulation of a PIM source. Furthermore, the portable RF transceiver 505 may be used to generate a map, or provide input to another device or module to enable generation of a map, of an area including identified PIM sources. Such map could then be used to identify and locate all PIM sources, and their potential for impact on the system, enabling an operator to make better decisions in relation to the area.

When the location of the PIM source 205 has been identified, the portable RF transceiver 505 may be configured to operate in an emission mode, where it emits the third RF stimulus signal. In particular, the portable RF transceiver 505 may be configured to operate in a switched manner between first and second modes, such that it may switch between operation in a first PIM locating mode and a second signal generating mode.

The portable RF transceiver 505 includes a switch 505c for this purpose, which enables the transmission and receiver portions 505a, 505b to be selectively coupled to the antenna 215b.

The system 500 includes a PIM tester 220' coupled to the antenna 210. The PIM tester 220' may be similar or identical to the PIM tester 220, but is illustrated in greater detail. The PIM tester 220' includes a local oscillators, for generating the first and second stimulus signals, amplifiers, band pass filters, and related components for outputting the first and second stimulus signals to the AUT 210 and receive PIM signals from the AUT 210.

While the above examples illustrate a single AUT, the skilled addressee will readily appreciate that the systems and methods may be adapted for multiple AUT.

Figure 6:
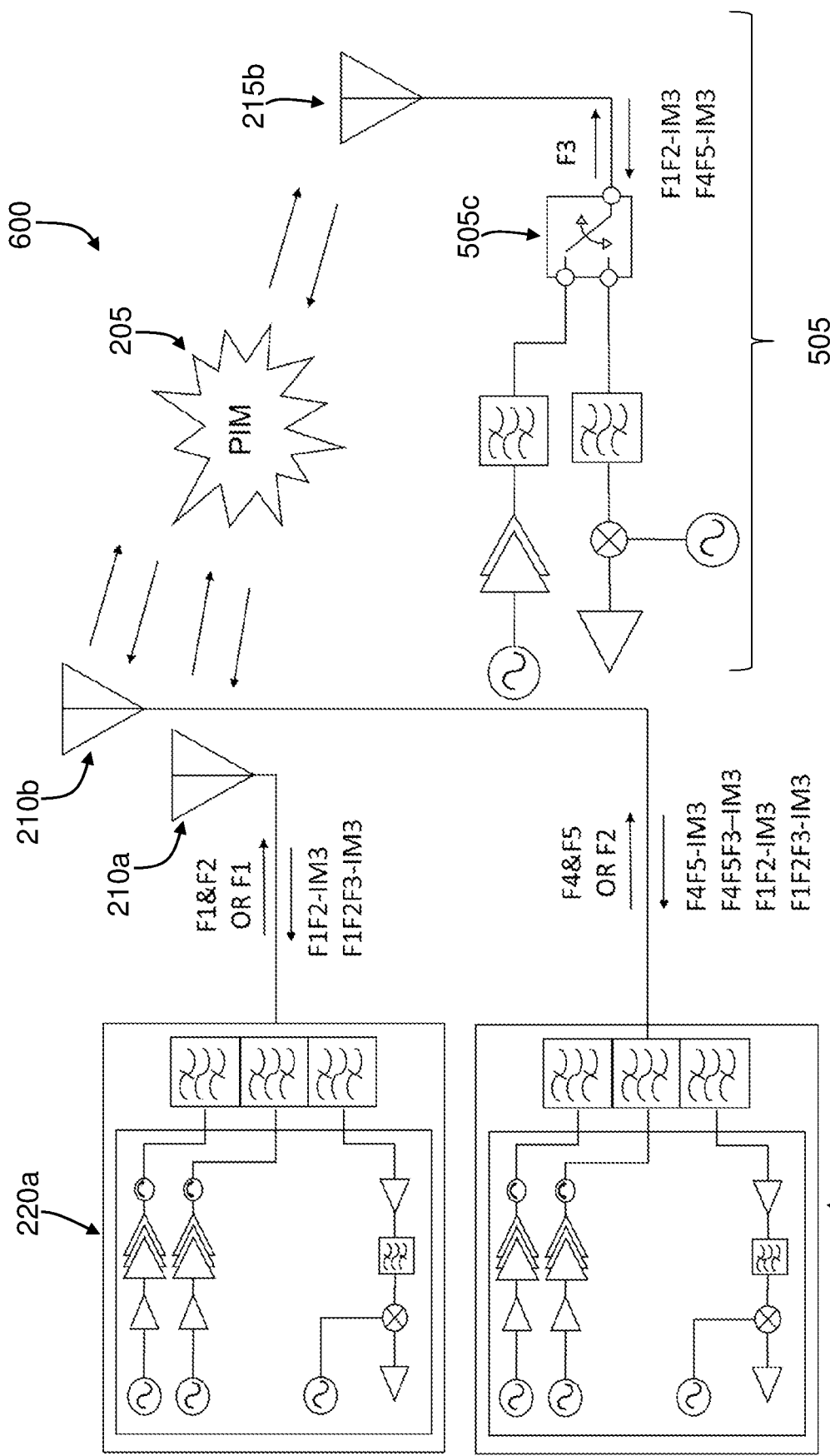
FIG. 6 illustrates a schematic of a system for identifying an external PIM source of first and second AUT, according to an embodiment of the present invention.

FIG. 6 illustrates a schematic of a system 600 for identifying an external PIM source 205 in first and second AUT 210a, 210b, according to an embodiment of the present invention.

The system 600 is similar to the system 500, but with a first and second AUT 210a, 210b, and first and second PIM testers 220a, 220b coupled to the respective first and second AUT 210a, 210b.

The first and second PIM testers 220a, 220b are identical to the PIM tester 220', but are configured to generate RF stimulus signals at different frequencies. In particular, the first PIM tester 220a is configured to generate first and second RF stimulus signals at frequencies F1 and F2, and the second PIM tester 220b is configured to generate fourth and fifth RF stimulus signals at frequencies F4 and F5. The portable RF transceiver 505 is configured to generate the third RF stimulus signal, as outlined above.

Each of the first and second PIM testers 220a, 220b may be configured to detect three-tone PIM signals based upon the RF stimulus signals that they emit, and the third RF stimulus signal from the portable RF transceiver 505.

Alternatively, the first and second PIM testers may be configured to emit a single RF stimulus signal each (e.g. the first PIM tester emits first RF signal at F1 and the second PIM tester emits the second RF signal at F2).

While the above embodiments describe pure tone signals, other embodiments may use the base transceiver station (BTS) radio signals to excite the PIM sources.

Figure 7:
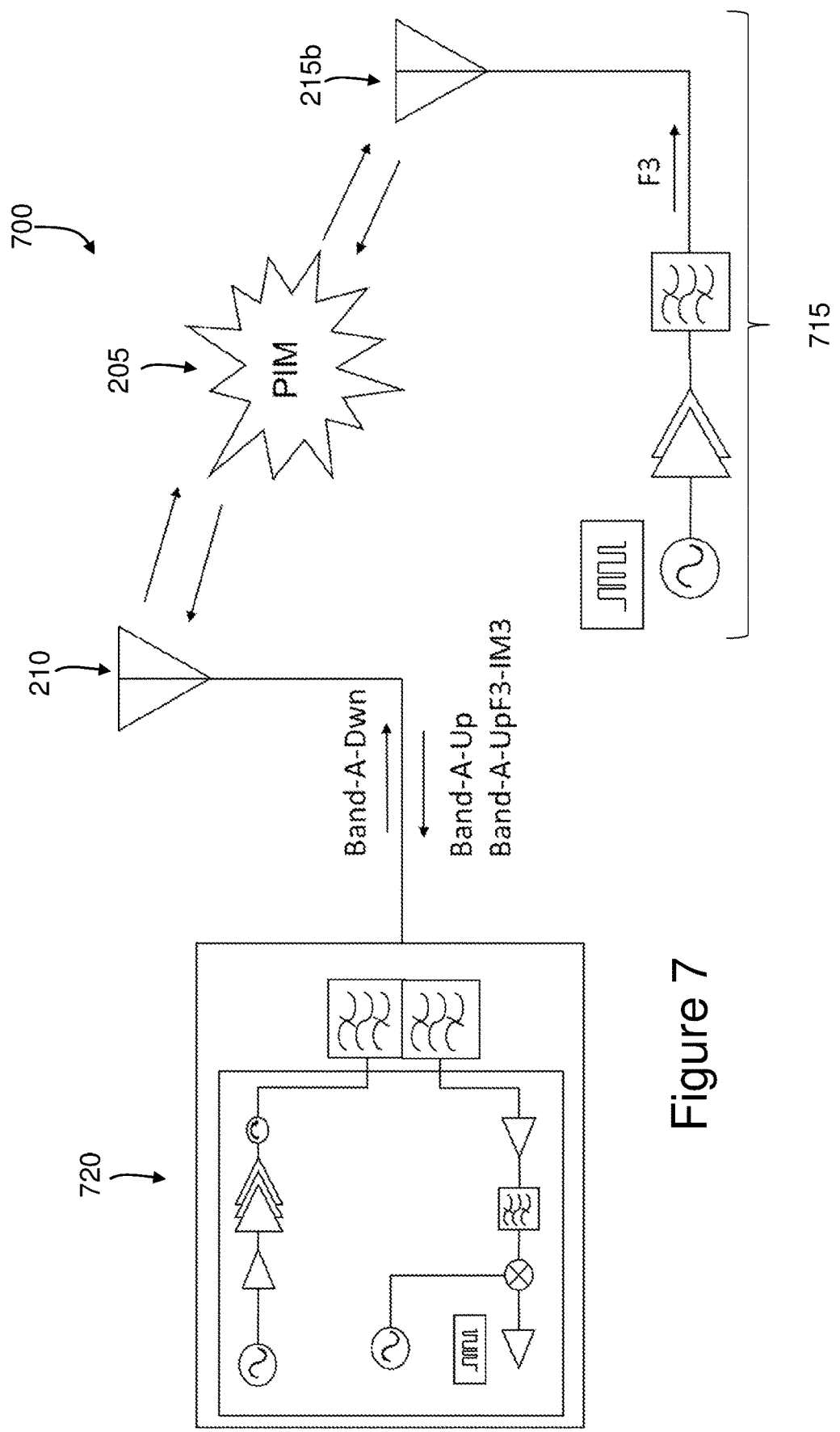
FIG. 7 illustrates a schematic of a system for identifying an external PIM source of an AUT, according to an embodiment of the present invention.

FIG. 7 illustrates a schematic of a system 700 for identifying an external PIM source 205 in an AUT 210, according to an embodiment of the present invention.

The system 700 is similar to the system 200, but with BTS radio 720 in place of the PIM tester 220. The BTS radio is configured to output an RF stimulus signal in the form of a pulsed envelope signal on Band-A downlink.

The system includes a portable RF emitter 715 similar to the portable RF emitter 215, but configured to emit a pulsed envelope signal at frequency F3.

The encoded PIM signal (encoded by F3) is then received at the BTS radio 720 as a pulsed noise floor rise.

Figure 8:
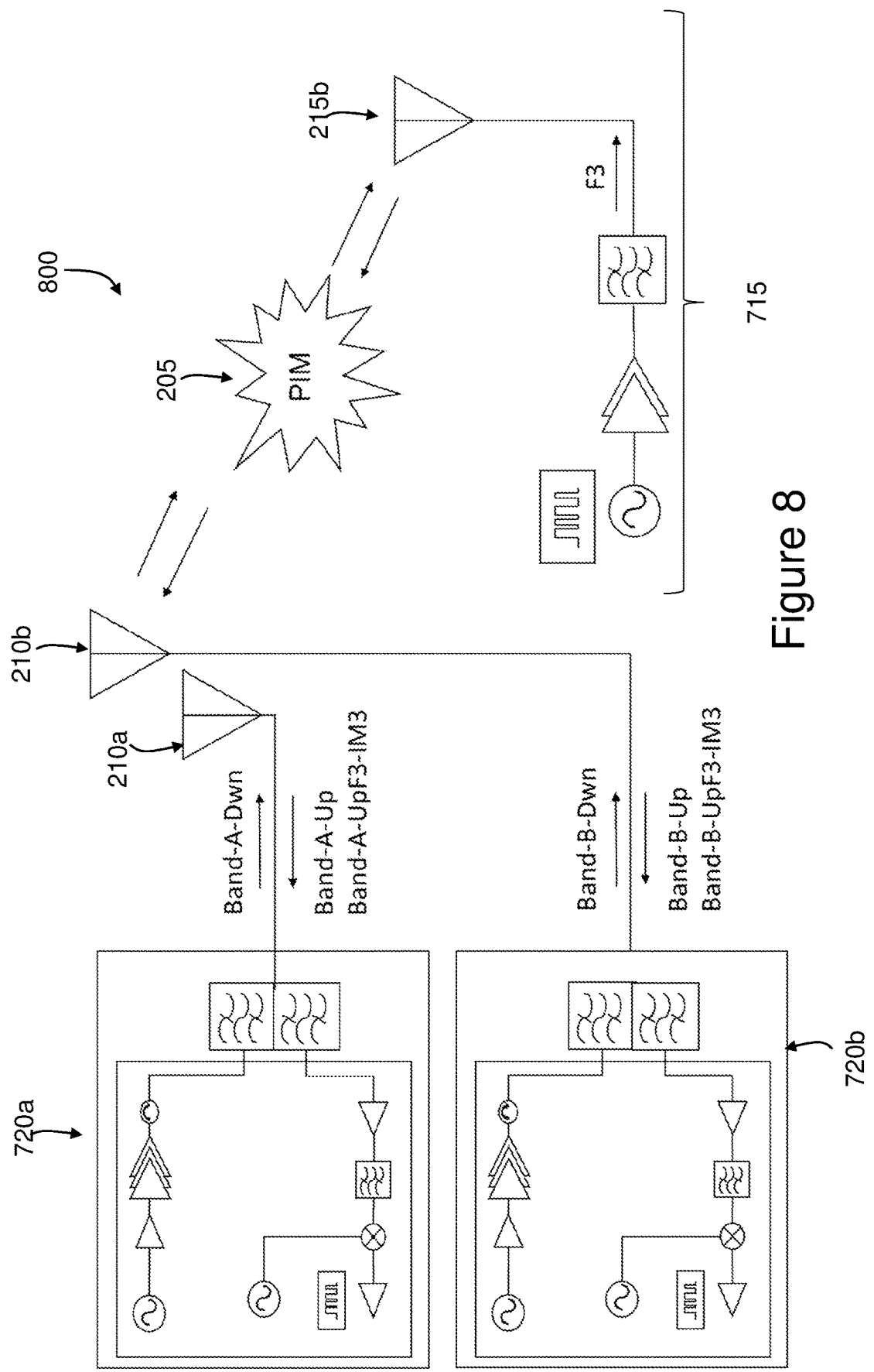
FIG. 8 illustrates a schematic of a system for identifying an external PIM source of first and second AUT, according to an embodiment of the present invention.

FIG. 8 illustrates a schematic of a system 800 for identifying an external PIM source 205 in first and second AUT 210a, 210b according to an embodiment of the present invention.

The system 800 is similar to the system 700, but extended to use first and second BTS radios 720a, 720b, and first and second AUT 210a, 210b.

The first BTS radio 720a outputs signals in Band A and the second BTS ration 720b outputs signals in band B.

While the above examples illustrate identification of external PIM sources, the skilled addressee will readily appreciate that the methods and systems may be used in relation to any type of PIM source. In particular, the techniques described herein may be used for trouble shooting PIM faults inside complex RF systems such as antennas.

Figure 9:
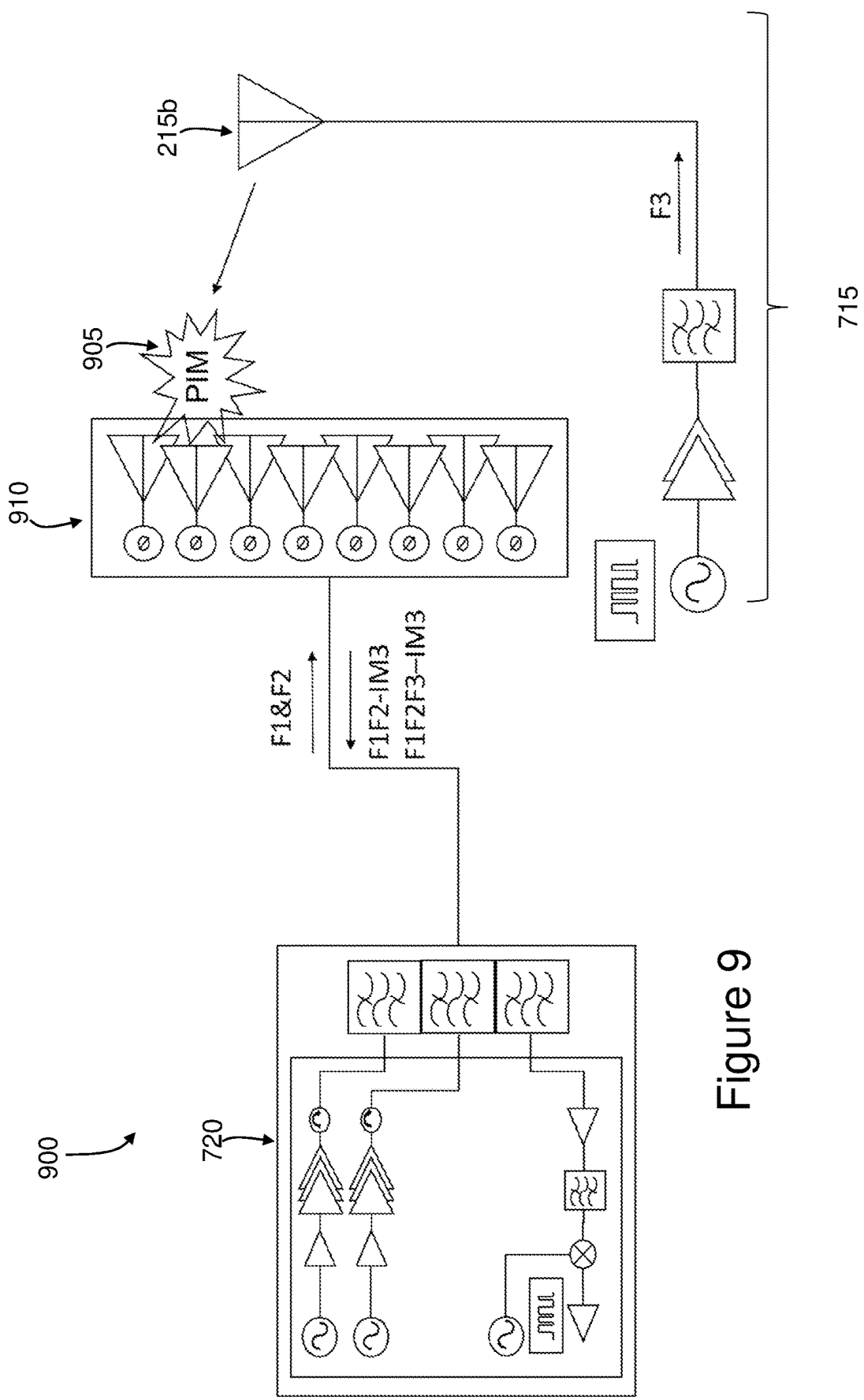
FIG. 9 illustrates a schematic of a system for identifying a PIM source of an AUT, according to an embodiment of the present invention.

FIG. 9 illustrates a schematic of a system 900 for identifying a PIM source 905 in an AUT 210a, according to an embodiment of the present invention.

The system 900 is similar to the system 700, but where the AUT comprises a phased array antenna 910 comprising a plurality of radiating elements, and the PIM source 905 is in (or associated with) one of the radiating elements.

The portable RF emitter 715 is used in the same way as for an external PIM source, but is directed towards different radiating elements of the antenna itself to help identify a location and impact of the PIM source 905.

Figure 10:
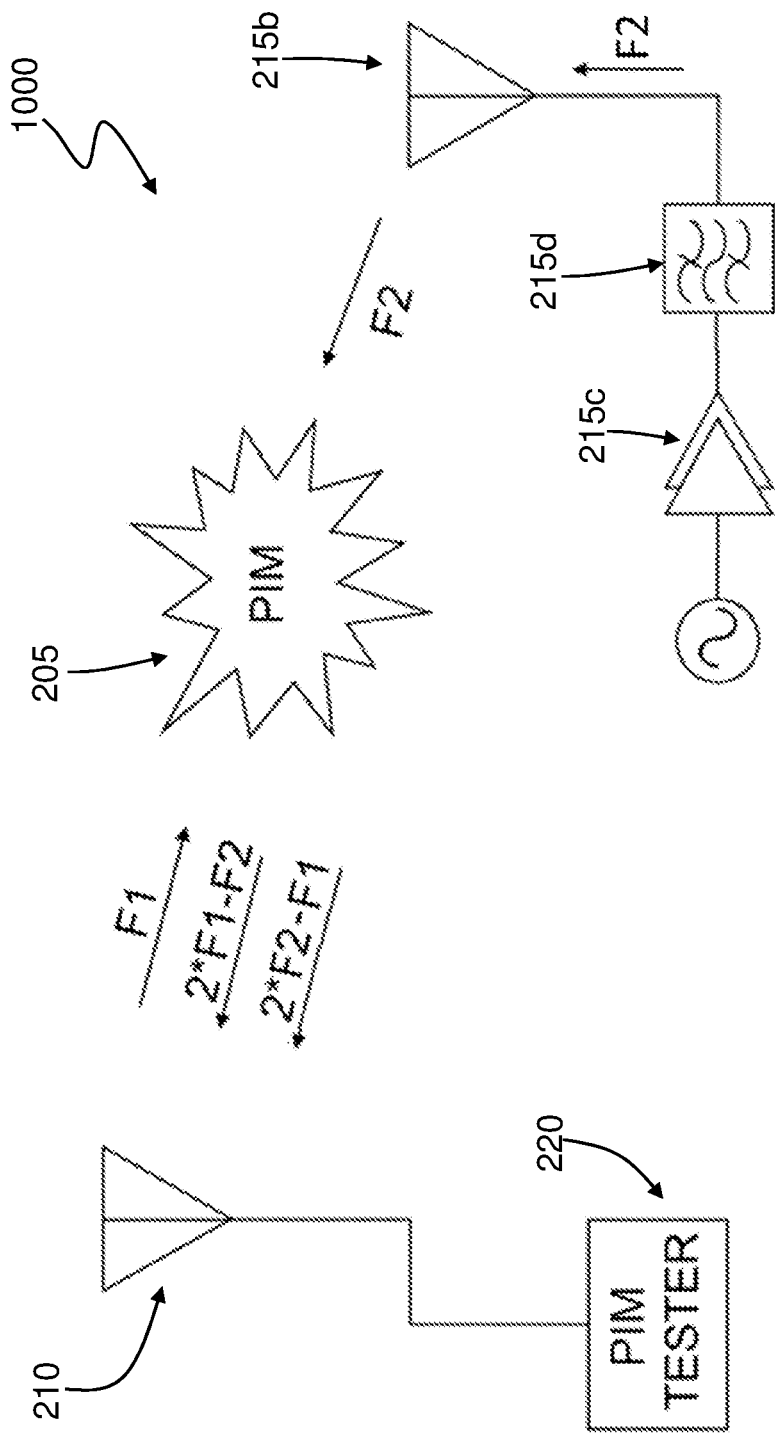
FIG. 10 illustrates a schematic of a system for PIM testing in an AUT, according to an embodiment of the present invention.

FIG. 10 illustrates a schematic of a system 1000 for PIM testing in an AUT 210, according to an embodiment of the present invention.

The system 1000 is similar to the system 200, but wherein the PIM tester 220 is configured to apply only a first RF stimulus signal to an input port of the AUT 210, such that the AUT 210 transmits a signal at frequency F1, and the portable RF emitter 215 emits a signal at Frequency F2 from an antenna 215b thereof.

The first RF stimulus signal from the AUT 210 and the second RF stimulus signal from the portable RF emitter 215 excite the PIM source 205 and generate PIM signals (2*F1−F2 and 2*F2−F1) that land within the receiver band of the PIM tester.

The system 1000 may not be able to identify a location and impact of an external PIM source in the same manner as the system 200, but is simpler than the system 200 of FIG. 2.

The signal F2 from the portable RF emitter 215 would typically be at least as strong as the signal F1, and could be much stronger than the signal F1, as the level of the third order products received at the AUT 210 will strongly depend on the power level of the F2 signal.

In alternative embodiments, the frequency of the portable RF emitter 215 could be changed from F2 to F3, wherein F3=2*F2. This results in the second order PIM product (rather than third order), namely F3-F1.

Some benefits of such approach is that the requirements of the filters 215d would be greatly reduced, as F1 an F3 have much greater separation. This also enables broad band functionality, as there is no need for narrow band filters for each transmission/receive plan.

Furthermore, F3 is out of band, which would typically require a license to transmit from the AUT 210. The portable RF emitter 215 operates, however, at much lower transmission levels since it only needs to match the power of F1 after a path loss of typically at least 30 dB, an because the order of the product is lower. As such, the portable RF emitter 215 may operate permissibly without a license.

Similarly, embodiments of the present invention include systems where the AUT transmits signals at frequencies F1 and F2 and the portable RF emitter 215 transmits signals at frequencies F3 and F4.

Such systems may detect the presence of PIM products from the two signals occurring at frequencies 2*F1−F2 or 2*F2−F1, and from the three signals together F1+F2−F3, F1−F2+F3, and −F1+F2+F3. The three frequency products are only generated from the PIM source under investigation, and the products with F4, for example F1+F2−F4, could be used in detection, can be out of band or even the power level of F4 signal is chosen low to conserve power.

The portable RF emitter 215 may detect third order products generated by its own signals, such as 2*F3−F4 and 2*F4−F3.

The above exemplary embodiments may be generalized into many signals at many frequencies and many antennae.

In the most general form 'n' stimulus signals are transmitted from the AUT and 'm' signals are transmitted from the portable RF emitter. For a system testing for 'O' intermodulation product order, the number of products that gets generated from only the AUT is P_AUT=(2 n+O−1)!/O! (2 n−1)!, and the number of Intermodulation products that are generated from the handheld emitter only is P_EMITTER=(2 m+O−1)!/O! (2 m−1)!. While the total number of tones are P_TOTAL=(2 (n+m)+O−1)!/O! (2 (n+m)−1)! . . . . The number of mixed tones depends on both sources, the AUT and the portable RF emitter, are P_MIXED=P_TOTAL-P_AUT-P_EMITTER. The above detailed case is the special case of n=2, m=1 and o=3.

It is important to note that not all of the PIM products are detectable some at DC or higher frequency harmonics may be out of band of interest. During normal operation, the P_AUT products may be monitored to make sure that the portable RF emitter does not change bias conditions of the nonlinear junctions. The P_MIXED are the encoded products that identify if the nearby non-linearity is an influential one. P_EMITTER products can be used to identify any nonlinearity in the vicinity of the mobile emitter.

While the above examples illustrate PIM testing, the systems may be modified to perform harmonic testing. In such case, RF stimulus signal in the 800-900 Mhz range may create second harmonics in the 1800 Mhz range. Such configuration is particularly useful for cellular base stations operating at different frequency bands.

Figure 11:
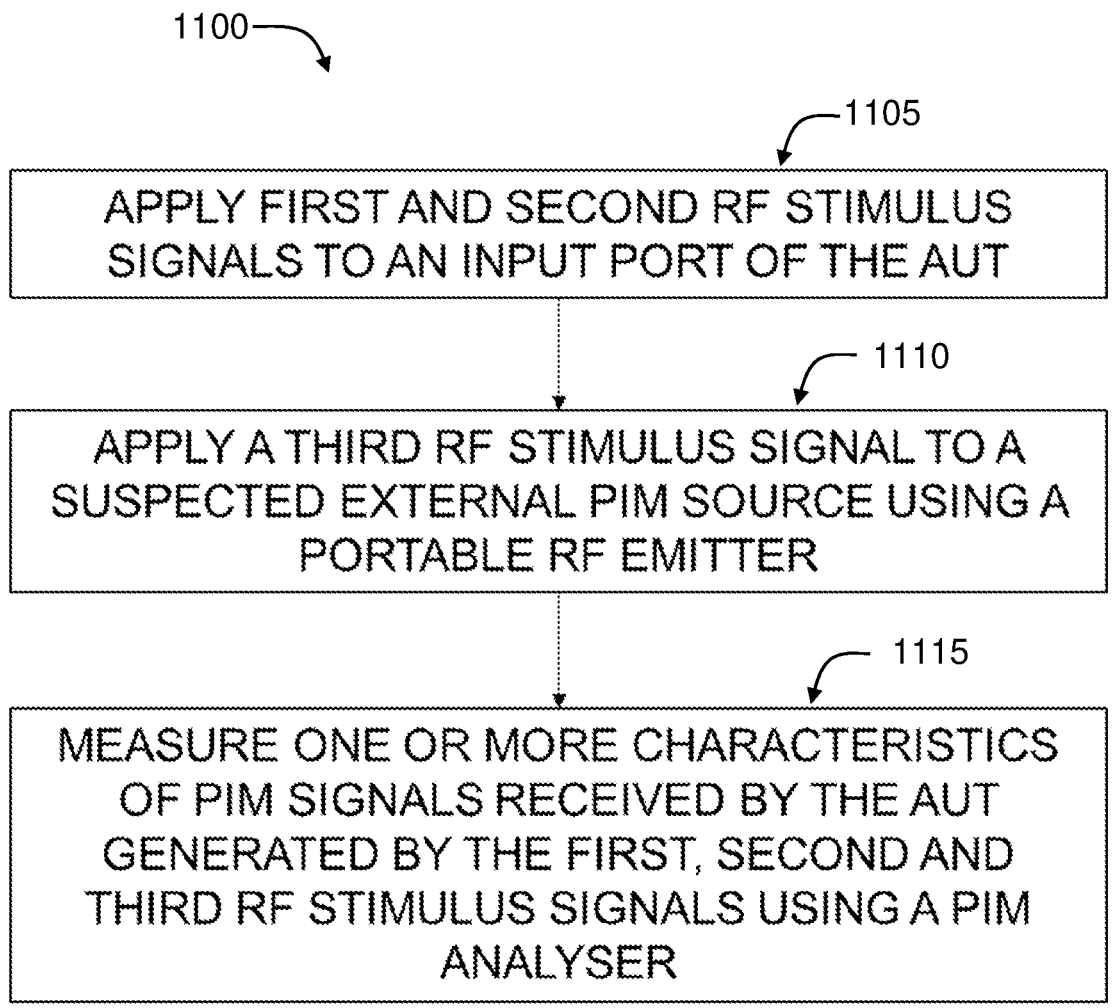
FIG. 11 illustrates a method for identifying an external passive intermodulation (PIM) source of an antenna under test (AUT), according to an embodiment of the present invention.

FIG. 11 illustrates a method 1100 for identifying an external passive intermodulation (PIM) source of an antenna under test (AUT), according to an embodiment of the present invention. The AUT is installed in a desired operating environment, and the method may be similar or identical to the methods performed in relation to the systems described above.

At step 1105, first and second RF stimulus signals are applied to an input port of the AUT. The first and second RF stimulus signals may have frequencies F1 and F2, as outlined above.

At step 1110, a third RF stimulus signal is applied directly to a suspected external PIM source using a portable RF emitter.

At step 1115, one or more characteristics of PIM signals received by the AUT generated by the first, second and third RF stimulus signals are measured. This may include comparing a magnitude of the three-tone PIM signal with a magnitude of a two-tone PIM signal generated from the first and second RF stimulus signals, as outlined above.

While the method 1100 uses first and second RF stimulus signals at the AUT, in alternative embodiments, methods use only a single RF stimulus signal at the AUT. Similarly, while only a single (third) stimulus signal is used at the portable RF emitter, in alternative embodiments, methods use multiple RF stimulus signals at the portable RF emitter.

While the above description makes reference to a third order PIM signal (IM3) of a two-tone PIM signal being 2*F1−F2, the skilled addressee will readily appreciate that a corresponding third order PIM signal is provided at 2*F2−F1, and the corresponding methods apply equally to low side and high side IM.

Advantageously, the systems and methods described above provide an efficient way of addressing PIM in an antenna installed in its operating environment. In particular, the systems and methods enable both identification of a location of PIM sources, including external PIM sources, but also identification of the impact of such PIM sources on the AUT. This in turn enables external PIM sources to be considered based upon their impact on the AUT, which in turn reduces time and cost associated with addressing PIM sources in the operating environment of the AUT.

In the present specification and claims (if any), the word 'comprising' and its derivatives including 'comprises' and 'comprise' include each of the stated integers but does not exclude the inclusion of one or more further integers.

Reference throughout this specification to 'one embodiment' or 'an embodiment' means that a particular feature, structure, or characteristic described in connection with the embodiment is included in at least one embodiment of the present invention. Thus, the appearance of the phrases 'in one embodiment' or 'in an embodiment' in various places throughout this specification are not necessarily all referring to the same embodiment. Furthermore, the particular features, structures, or characteristics may be combined in any suitable manner in one or more combinations.

In compliance with the statute, the invention has been described in language more or less specific to structural or methodical features. It is to be understood that the invention is not limited to specific features shown or described since the means herein described comprises preferred forms of putting the invention into effect. The invention is, therefore, claimed in any of its forms or modifications within the proper scope of the appended claims (if any) appropriately interpreted by those skilled in the art.

The invention claimed is:

1. A system for identifying an external passive intermodulation (PIM) source of at least one antenna under test (AUT), the AUT installed in a desired operating environment, the system comprising:
   a PIM analyser, connected to the AUT for applying first and second radio frequency (RF) stimulus signals to an input port of the AUT; and
   a portable RF emitter, configured to apply a third RF stimulus signal to a suspected external PIM source of a plurality of suspected external PIM sources, and reconfigurable to apply the third RF stimulus signal to each of the plurality of suspected external PIM sources;
   wherein the PIM analyser is configured to measure one or more characteristics of PIM signals received by the AUT generated by the first, second and third RF stimulus signals to identify whether the suspected external PIM source is an external PIM source.

2. The system of claim 1, wherein the portable RF emitter is configured to generate the third RF stimulus signal at a selected frequency of a plurality of different operating frequencies.

3. The system of claim 1, wherein the third RF stimulus signal is generated at a frequency such that a resultant PIM signal from the third RF stimulus signal is at a frequency in a receiver band of the PIM analyser.

4. The system of claim 1, wherein the resultant PIM signal measured by the PIM analyser comprises a third order PIM signal from the first, second and third RF stimulus signals.

5. The system of claim 1, wherein the first and second RF stimulus signals comprise signals generated using one or more local oscillators.

6. The system of claim 1, wherein the first and second RF stimulus signals comprise base transceiver station (BTS) radio signals, and wherein the BTS radio signals comprise pulsed envelope signals.

7. The system of claim 1, further configured to determine an impact on the AUT of a suspected external PIM source to which the third RF stimulus signal is applied.

8. The system of claim 7, configured to determine the impact of the suspected external PIM source according to a magnitude of a third order PIM signal from the first, second and third RF stimulus signals.

9. The system of claim 1, wherein the system further includes a second AUT, configured to be tested simultaneously with the AUT.

10. The system of claim 9, further including a second PIM analyser connected to the second AUT.

11. The system of claim 1, wherein the portable RF emitter is configured to apply the third RF stimulus signal to suspected external PIM sources by applying the third RF stimulus signal in close proximity to the suspected external PIM sources.

12. The system of claim 11, wherein the portable RF emitter is configured to apply the third RF stimulus signal within about 1 m of the suspected external PIM sources.

13. The system of claim 1, wherein the portable RF emitter comprises an elongate wand, wherein the third signal is emitted from an end thereof.

14. The system of claim 1, wherein the portable RF emitter includes a receiver, for receiving one or more PIM signals, wherein the receiver is configured to determine a magnitude of a third order PIM signal from the first and second RF stimulus signals.

15. The system of claim 14, further including a display associated with the receiver, the display being configured to display a magnitude of the PIM signal.

16. The system of claim 14, configured to emit an alarm (e.g. an audible alarm) when the magnitude of the signal is above a threshold.

17. The system of claim 14, wherein the portable RF emitter and receiver is configured to operate in a switched manner between first and second modes, such that it may operate in a first PIM locating mode, where the receiver is configured to receive PIM from the first and second signals for locating, and a second signal generating mode, where the emitter is configured to emit the third RF stimulus signal.

18. A method for identifying an external passive intermodulation (PIM) source of at least one antenna under test (AUT), the AUT installed in a desired operating environment, the method including:
   applying first and second radio frequency (RF) stimulus signals to an input port of the AUT;
   applying a third RF stimulus signal to a suspected external PIM source of a plurality of suspected external PIM sources using a portable RF emitter, the portable RF emitter reconfigurable to apply the third RF stimulus signal to each of the plurality of suspected external PIM sources; and
   measuring one or more characteristics of PIM signals received by the AUT generated by the first, second and third RF stimulus signals using a PIM analyser to identify whether the suspected external PIM source is an external PIM source.

19. A system for passive intermodulation (PIM) or harmonic testing of at least one antenna under test (AUT), the system comprising:
   a signal generator, connected to the AUT for applying one or more radio frequency (RF) stimulus signals to an input port of the AUT; and
   a portable RF emitter, configured to apply an RF stimulus signal to a suspected PIM source of a plurality of suspected external PIM sources, the portable RF emitter reconfigurable to apply the RF stimulus signal to each of the plurality of suspected external PIM sources.

20. The system of claim 19, wherein the one or more RF stimulus signals comprises a single tone.

* * * * *